(12) United States Patent
Masson et al.

(10) Patent No.: US 7,642,766 B2
(45) Date of Patent: Jan. 5, 2010

(54) METHOD AND DEVICE FOR MEASURING WITH SYNCHRONOUS DETECTION AND CORRELATED SAMPLING

(75) Inventors: Thierry Masson, Varces (FR); Fabrice Salvi, Grenoble (FR)

(73) Assignee: Atmel Grenoble (FR)

( * ) Notice: Subject to any disclaimer, the term of this patent is extended or adjusted under 35 U.S.C. 154(b) by 152 days.

(21) Appl. No.: 11/579,062

(22) PCT Filed: Apr. 20, 2005

(86) PCT No.: PCT/EP2005/051755

§ 371 (c)(1),
(2), (4) Date: Aug. 21, 2007

(87) PCT Pub. No.: WO2005/103739

PCT Pub. Date: Nov. 3, 2005

(65) Prior Publication Data

US 2008/0100280 A1    May 1, 2008

(30) Foreign Application Priority Data

Apr. 27, 2004   (FR)   ................................ 04 04458

(51) Int. Cl.
*G01R 19/00*   (2006.01)
*G01N 21/00*   (2006.01)
(52) U.S. Cl. .................. 324/76.38; 324/76.11; 356/434
(58) Field of Classification Search .............. 324/76.11, 324/76.24, 76.33, 76.38; 356/434, 445
See application file for complete search history.

(56) References Cited

U.S. PATENT DOCUMENTS

| | | | | |
|---|---|---|---|---|
| 3,416,081 A | * | 12/1968 | Gutleber | 324/76.33 |
| 3,777,133 A | * | 12/1973 | Beck et al. | 708/425 |
| 4,097,801 A | * | 6/1978 | Freeman et al. | 368/120 |
| 4,262,258 A | * | 4/1981 | Frosch et al. | 327/91 |

FOREIGN PATENT DOCUMENTS

| | | |
|---|---|---|
| JP | 2003 018477 A | 5/2003 |
| JP | 2003 134405 A | 9/2003 |

* cited by examiner

*Primary Examiner*—Timothy J Dole
*Assistant Examiner*—Farhana Hoque
(74) *Attorney, Agent, or Firm*—Lowe Hauptman Ham & Berner, LLP (57) ABSTRACT

The invention relates to electronic circuits for measuring, by synchronous detection, weak signals whose reference level is not well known and is subject to large fluctuations. A first correlated double sampling is performed between a time T1 situated just before the start of the measurement pulse and a time T2 situated just before the end of the measurement pulse; subsequently, a second correlated double sampling is performed between time T2 and a time T3 situated after the end of the measurement pulse. Finally, the difference between signal levels coming from the two measurements is taken, this difference being a representation of the signal value Vm considered with respect to a reference level that is intermediate between the reference levels at times T1 and T3.

13 Claims, 5 Drawing Sheets

METHOD AND DEVICE FOR MEASURING WITH SYNCHRONOUS DETECTION AND CORRELATED SAMPLING

FIELD OF THE INVENTION

The invention relates to electronic circuits for measuring weak signals whose reference level is, on the one hand, not well known and, on the other, subject to large fluctuations.

BACKGROUND OF THE INVENTION

The typical application envisioned is the following: measurement of light transmission or reflection coefficient of a medium through which light passes, by means of a light-emitting cell and a photosensitive cell, or measurement of the variations of this transmission or reflection coefficient. In the presence of an ambient illumination of unknown and variable luminosity, or even an ambient illumination of much greater intensity than the illumination produced by the light-emitting cell, it will be understood that the measurement is not easy.

In order to overcome this drawback, a synchronous measurement is performed: the light-emitting cell emits periodic light pulses and the signal received by the photosensitive cell is observed during the emission times; in addition, a differential measurement is carried out at two different times, namely just before the start of the pulse and just before the end of the pulse. The difference in the measured signals will then represent an increase in illumination specifically due to the light produced by the light-emitting cell and having passed through the medium to be measured.

This differential measurement is called 'correlated double sampling' when the signals are measured by means of a sample-and-hold. A sample-and-hold is used notably when the signal coming from the measurement, obtained in analog form (this is the case for a photosensitive cell), has to be converted into a digital value by an analog-digital converter. In this case, the sample-and-hold is designed to directly perform a differential measurement, in other words it directly delivers an electrical voltage value representing, rather than each measurement of illumination, the difference between the measurements made just before the start of the pulse and just before the end of the pulse.

Figure 1:
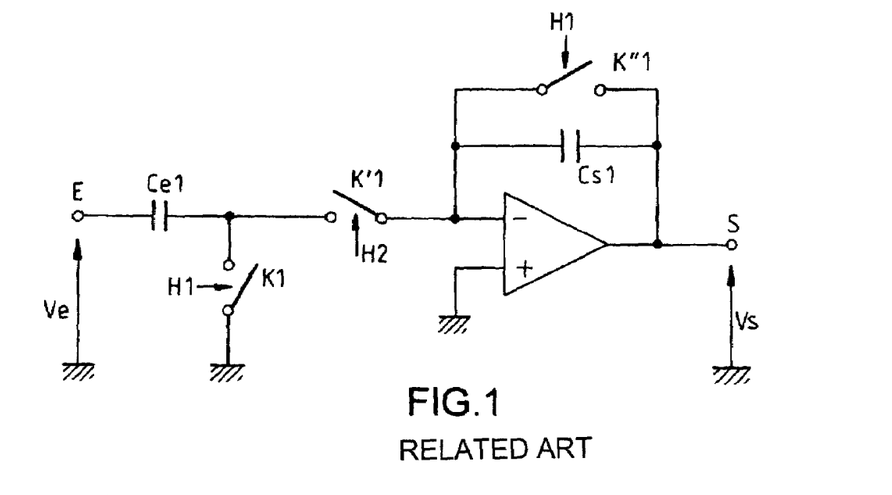
FIGS. 1 to 4, already described, show a conventional useful signal measurement, in the presence of an unknown reference level, by synchronous detection and correlated double sampling.

FIG. 1 shows an example of schematic circuit diagram of a sample-and-hold capable of making this direct differential measurement. The input E receives the measurement signal Ve (for example a signal produced by a photosensitive cell) which is equal to a reference level Vr, representing the ambient illumination, which is unknown, that exists in the absence of the light pulses. The input E is connected to a first terminal of an input capacitor Ce1 whose second terminal may be connected either to ground via a switch K1 or to the inverting input (−) of an operational amplifier AMP via a switch K'1. The operational amplifier, with high gain and high input impedance, has its noninverting input (+) connected to ground and its two inputs are considered as being virtually at ground potential. An integrating capacitor Cs1 is connected between the inverting input and the output S of the operational amplifier. A switch K"1 allows the integrating capacitor Cs1 to be short-circuited in order to periodically discharge it.

The switches K1 and K"1 are closed at the same time as the switch K'1 is open, during a reset phase H1 that ends just before the light pulse emitted by the light-emitting cell. The input capacitor Ce1 therefore charges up to the reference voltage Ve=Vr present at the input just before the light pulse; the integrating capacitor Cs1 is completely discharged. Then, the switches K1 and K"1 are opened and the switch K'1 is closed during a sampling phase H2 following the reset phase. During this phase H2, the light pulse is emitted. The sampling phase ends before the end of the light pulse, but only when the signal from the photoelectric cell is stabilized. The voltage Ve at the input E is then Vm, which is different from Vr due to the light pulse.

Owing to the conservation of the charges on the joined and isolated electrodes of the capacitors Ce1 and Cs1 (total charge Ce1Vr), the charges are divided up between the capacitor Ce1 and the capacitor Cs1 and, owing to the potential of the inverting input of the amplifier being virtually held at ground, the potential adopted by the output S is $Vs=-Ce1(Vm-Vr)/Cs1$.

This output potential Vs is therefore equal to the inverse of Vm−Vr if Ce1 and Cs1 are equal, or proportional to −(Vm−Vr) if this is not the case.

The output potential Vs is subsequently maintained during a hold phase (after the end of the sampling period H2, when all the switches K1, K'1, K"1 are open); this potential, held at its value until the next period H1, can be used for an analog-digital conversion since it is proportional to Vm−Vr; it directly represents the signal difference due to the light pulse, irrespective of the level of ambient light.

Figure 2:
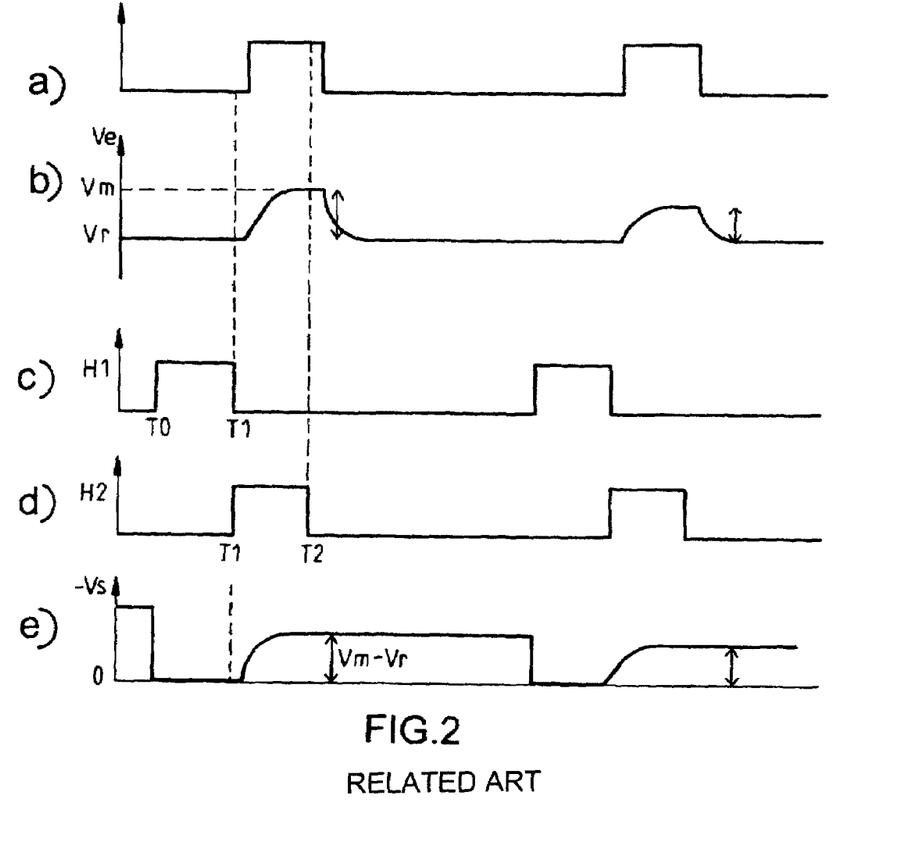

FIG. 2 shows the signal timing diagram corresponding to the operation of the circuit in FIG. 1:

- the line a represents the periodic light pulse emission time intervals;
- the line b represents the signal detected by the photosensitive cell; the signal level due to the ambient light just before the light pulse is Ve=Vr; the signal Vm measured at the end of the light pulse represents the addition of the ambient illumination and the illumination due to the light pulse;
- the line c represents the control period of the switches K1 and K"1, corresponding to the reset phase H1; its duration is, for example, the same as that of the light pulse but beginning at a time T0 before the start of the light pulse and ending at a time T1 just before the end of the light pulse;
- the line d represents the sampling signal H2 which controls the switch K'1; it begins just after the end of the reset signal H1 and ends at a time T2 just before the end of the light pulse; its duration is that of the light pulse;
- finally, the line e represents the inverse −Vs of the output voltage Vs, which goes to zero during the period H1 (reset) and which takes the value Vm−Vr during the period H2 (sampling) then keeps this value until the following measurement (hold).

This method of correlated double sampling associated with a synchronous detection yields excellent results.

Figure 3:
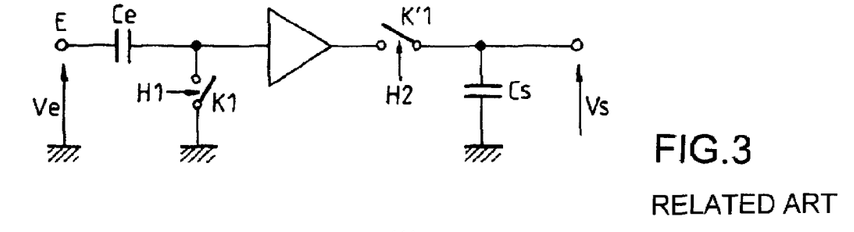
Figure 4:
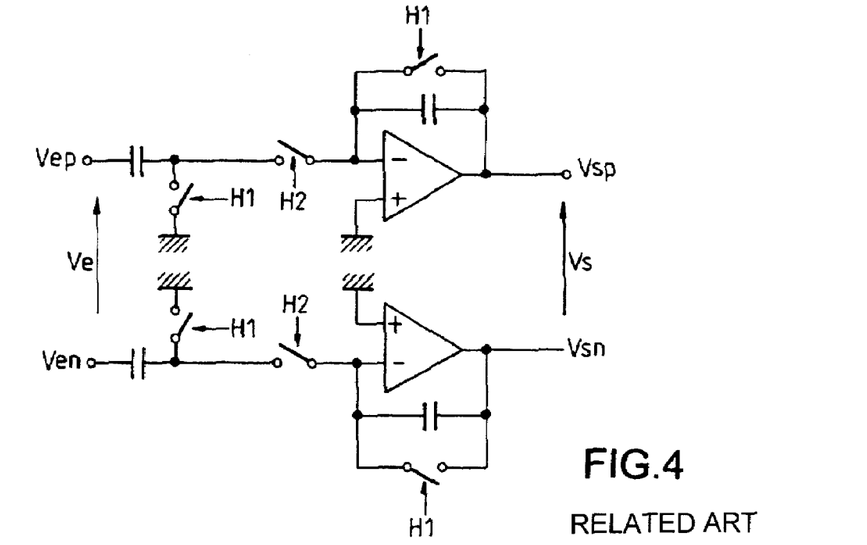

Other types of samplers, more or less complex, exist and are capable of performing the correlated double sampling operation. FIG. 3 shows a particularly simple sampler from the prior art; FIG. 4 shows a differential sample-and-hold, accomplishing the same correlated double sampling function, but on a differential useful signal Ve representing the difference between two voltages Vep and Ven referenced with respect to ground.

The invention is based on the observation that, in some applications, this measurement method by synchronous detection and correlated double sampling is not satisfactory. These applications are those in which the reference level of the measured signal (for example the level Vr representing the ambient illumination) is not sufficiently stable. In fact, the method assumes that the reference level has not changed between the beginning and the end of the signal H2.

However, the duration of the signal H2 cannot be reduced below a minimum time. It must be at least long enough so that the measurement signal has had the time to stabilize after the start of the light pulse. The stabilization time is linked to the response time of the photosensitive cell and of all the electronic circuits that allow the voltage Ve to be established at the input of the sample-and-hold.

Typically, the duration of H2 can be 30 microseconds. But if the reference level Vr has the time to vary significantly during this period, the differential measurement will be affected by an error since it takes the difference between the level Vm attained at time T2 during the pulse and the reference level V1 considered at time T1 before the start of the pulse, rather than taking the difference at the same moment.

In a particularly important application envisioned here, it has been noticed that the variations of the ambient illumination over the duration of the short pulse of the synchronous measurement could lead to a significant measurement error, rendering the application inoperative in certain cases. This application is the detection of rain on a vehicle windshield with a view to triggering the automatic sweeping by the windshield wipers. The detection is carried out by a photoelectric cell (visible or infrared light) which detects the changes in reflection coefficient of the windshield depending on the presence or absence of rain. The change in reflection induces small changes in measurement signal level, where these changes may be a thousand times weaker than the signal due to the ambient illumination. However, the ambient illumination is subject to variations that are all the more rapid the higher the vehicle speed (passage under bridges, trees, etc.). The variations in 30 microseconds are very significant, and induce measurement errors that can mask the variations in reflection coefficient that it is desired to measure. The presence of rain could be detected whereas this is simply the result of a measurement error.

SUMMARY OF THE INVENTION

For this reason, the invention provides a measurement method and device with detection that is synchronous with respect to a measurement pulse, this method and this device allowing the measurement errors due to the variations in reference level to be minimized. This method and this device may be used in the aforementioned application, but also in other applications where significant and rapid variations of the reference level (signal level generated in the absence of the pulse) could occur. By 'measurement method with synchronous detection' is understood a measurement method in which, in order to determine the value of a parameter to be measured, the value of a measurement signal is detected, in synchronism with a short measurement pulse that causes a temporary increase in this signal. Thus, for a measurement of light reflection or transmission coefficient in an ambient light environment, a short light pulse is emitted and the reflected or transmitted signal is measured during this emission.

With the aim of partially compensating for the influence of the variations, over the duration of the measurement pulse, of a reference level of the measured signal, the measurement method with synchronous detection according to the invention consists in performing, within a sample-and-hold circuit:
 a first correlated double sampling between a time T1 situated just before the start of the measurement pulse and a time T2 situated just before the end of the measurement pulse, this double sampling supplying a signal measurement Vm considered with respect to a reference level V1 before the start of the pulse;
 and a second correlated double sampling between time T2 and a time T3 situated after the end of the measurement pulse, this second sampling supplying a representation of the signal measurement Vm considered with respect to a reference level V3 existing after the end of the pulse;
 and in establishing a difference between signal levels coming from the two measurements, this difference being a representation of the signal value Vm considered with respect to a reference level that is intermediate between the reference levels at times T1 and T3.

The time interval T3–T2 is preferably substantially equal to T2–T1; the difference between the signal levels produced by the two measurements is then a representation of the signal value Vm with respect to the average value between the reference levels V1 and V3.

It will be understood that, if the two operations for correlated double sampling are performed in an identical manner (notably without change of sign or gain), and if they give respective representations of level differences Vm–V1 then V3–Vm, just simply taking the difference between the two sampling results will yield a useful signal level equal to 2[Vm–(V3+V1)/2] rather than [Vm–(V3+1)/2]; the signal actually sought will therefore be half of the difference found. Since the output signals of the sample-and-hold circuits are, in principle, digitized, the division by two could, if desired although it is not necessarily indispensable, be performed after digitization. However, certain features of analog circuits may also be employed if desired, without changing the principle of the invention, in order to directly obtain the desired value [Vm–(V3+V1)/2], for example a capacitive division or, quite simply, a choice of integrating capacitor that has twice the value of the input capacitor, etc.

The measurement device according to the invention, with detection that is synchronous with respect to a measurement pulse which causes a temporary increase in a signal to be measured, comprises at least one sample-and-hold and switching means synchronized with the measurement pulse in order to perform by means of the sample-and-hold:
 a first correlated double sampling between a time T1 situated just before the start of the measurement pulse and a time T2 situated just before the end of the measurement pulse, this double sampling supplying a signal measurement Vm considered with respect to a reference level V1 before the start of the pulse;
 and a second correlated double sampling between time T2 and a time T3 situated after the end of the measurement pulse (preferably T3–T2=T2–T1), this second sampling supplying a representation of the signal measurement Vm considered with respect to a reference level V3 existing after the end of the pulse,
 the measurement device comprising means for establishing a difference between signal levels coming from the two measurements, this difference being a representation of the signal value Vm considered with respect to a reference level that is intermediate between the reference levels at times T1 and T3.

In a simple embodiment, two sample-and-holds will be used for establishing the voltage levels V1–Vm and Vm–V3 and a subtractor will be placed at the output of the samplers for performing the difference sought.

In another embodiment, a differential sample-and-hold will be used, in order to avoid the measurement signals being referenced to a ground. The differential sample-and-hold will comprise, according to the invention, a first operational amplifier and a second operational amplifier, each one being associated with a first and a second input capacitor placed upstream of an input of the respective amplifier, and being also associated with an integrating capacitor connected between the input and the output of the amplifier, the signal inputs of the sampler connected to the first input capacitors being crossed with respect to the signal inputs connected to the second input capacitors; the switching means comprising:

means for making the sample-and-hold operate as a correlated double sample-and-hold using the integrating capacitors and the first input capacitors, by initially applying, across the first input capacitors, a differential input voltage V1p−V1n representing the reference signal V1 at time T1 and later a differential input voltage Vmp−Vmn representing the measurement signal Vm at time T2;

means for making the differential sample-and-hold operate as a correlated double sampler, using the integrating capacitors and the second input capacitors, by initially applying, across the second input capacitors, a differential input voltage Vmn−Vmp representing the inverse −Vm of the useful signal at time T2 and later a differential input voltage V3n−V3p representing the inverse −V3 of the reference signal at time T3.

The differential sample-and-hold circuit thus formed operates as a triple sampler correlated with a useful signal measurement level and two reference levels taken before and after the measurement pulse, respectively, and it performs directly the difference Vm−(V3+V1)/2 delivering this difference itself in differential form (hence with no reference relative to a ground). It will be noted that the operational amplifiers of the differential sample-and-hold may or may not be equipped with a switch for periodically discharging the integrating capacitor. If this is the case then this switch is closed during the time interval from T1 to T2 in order to ensure the reset to zero of the charge on the capacitor. Otherwise (no reset to zero of the integrating capacitor by a short-circuit), another means is provided for periodically applying to the integrating capacitor a charge representing the inverse of the mean value of the useful output signal. This last solution will be used notably when the useful output signal is in any case going to be filtered by a low-pass filter before being exploited, since this mean value (filter output) will then be available.

The two operational amplifiers may be replaced by a single differential amplifier with two differential inputs and two differential outputs. In this case, the structure of the circuit can be reformulated in the following manner: the differential sample-and-hold circuit comprises a differential amplifier with two inputs and two outputs, each input being associated with a first and a second input capacitor placed upstream of this input, and being also associated with an integrating capacitor connected between the input and a corresponding output of the amplifier, the signal inputs of the sampler connected to the first input capacitors being crossed with respect to the signal inputs connected to the second input capacitors; the switching means comprise:

means for making the sample-and-hold operate as a correlated double sample-and-hold using the integrating capacitors and the first input capacitors, by initially applying, across the first input capacitors, a differential input voltage V1p−V1n representing the reference signal V1 at time T1 and later a differential input voltage Vmp−Vmn representing the measurement signal Vm at time T2;

means for making the differential sample-and-hold operate as a correlated double sampler, using the integrating capacitors and the second input capacitors, by initially applying, across the second input capacitors, a differential input voltage Vmn−Vmp representing the inverse −Vm of the useful signal at time T2 and later a differential input voltage V3n−V3p representing the inverse −V3 of the reference signal at time T3.

This definition should be considered as equivalent to the definition using two separate operational amplifiers.

BRIEF DESCRIPTION OF DRAWINGS

Other features and advantages of the invention will become apparent upon reading the detailed description that follows and which is presented with reference to the appended drawings, in which.

DETAILED DESCRIPTION OF PREFERRED EMBODIMENTS

Figure 5:
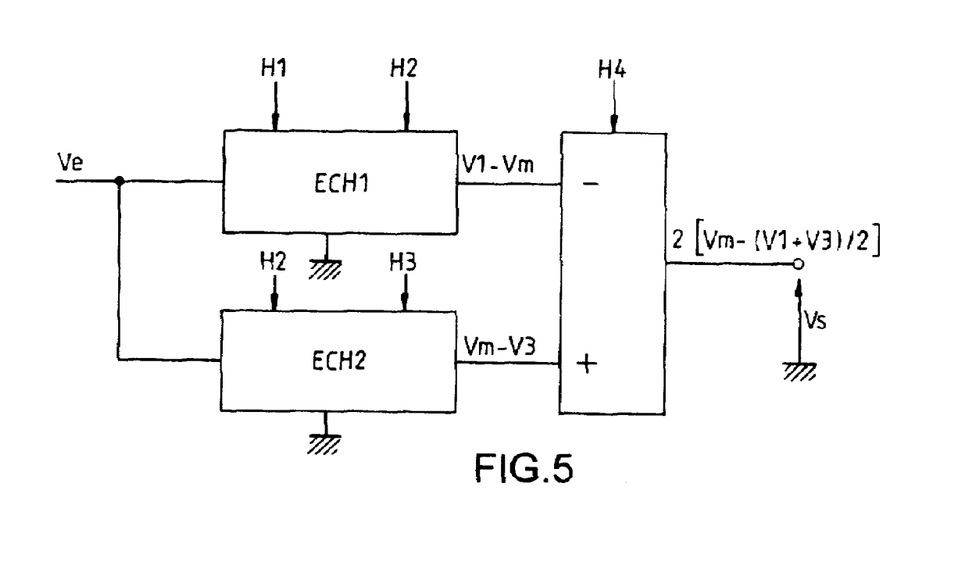
FIG. 5 shows a schematic circuit diagram of the invention.

In FIG. 5, there are two sample-and-hold circuits ECH1 and ECH2 receiving one and the same input signal Ve. The input signal is a signal resulting from a measurement in synchronous detection mode, in other words, as is explained hereinabove, a signal resulting from a measurement pulse allowing a useful measurement signal to be superimposed onto an unknown reference level. The two sample-and-hold circuits operate in correlated double sampling mode, but over different time intervals.

The first sampler ECH1 operates with a reset phase H1 beginning at a time T0 and ending at a time T1 situated just before the start of the measurement pulse, with a sampling phase H2 beginning at time T1 and ending at a time T2 situated just before the end of the measurement pulse, and with a hold phase that follows the sampling phase. This first sampler delivers an output voltage Vs proportional to −(Vm−V1), where V1 is the value of Ve at time T1 (reference value prior to the pulse), and Vm is the value of Ve at time T2 (measurement value during the pulse). The time T1−T0 is preferably the same as the duration of the measurement pulse, as is also the time T2−T1.

The second sampler ECH2 operates with a reset phase that ends just before the end of the measurement pulse, and a sampling phase that begins at the end of the reset phase and that ends at a time T3 situated after the end of the measurement pulse. Preferably, the reset phase coincides with the phase H2 (start at T1, end at T2); the sampling phase H3 begins at time T2 and ends at a time T3 which is preferably such that the duration of the phase H3 is the same as that of the phase H2. The end of the sampling phase H3 is followed by a hold phase. This hold phase comprises at least some duration that is simultaneous with the hold phase of the first sampler. The common part runs from time T3 up to the next reset phase (time T'0). During this phase, the second sampler delivers a voltage proportional to Vm−V3, where V3 is the value of Ve at time T3, in other words the reference value after the measurement pulse.

A subtractor receives the outputs from the two samplers and allows the difference to be obtained, during a time interval that can be defined by a period H4 running from T3 to T'0 or situated inside of this interval, between the held voltage levels obtained after time T3 at the outputs of the two samplers.

Figure 6:
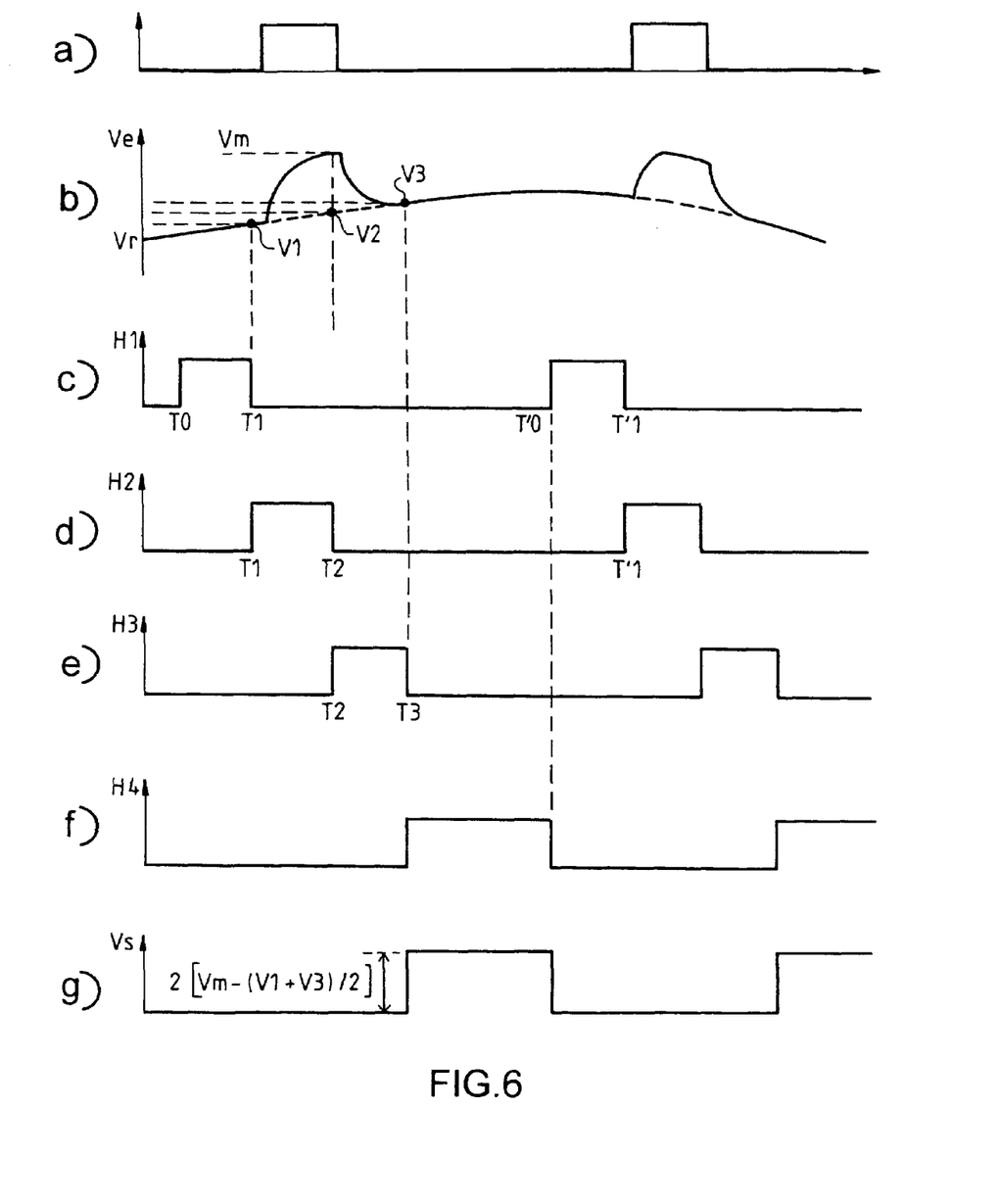
FIG. 6 shows a timing diagram corresponding to FIG. 5.

FIG. 6 shows a timing diagram of operational signals from the measurement circuit in FIG. 5.

line a: periodic measurement pulses with a view to synchronous detection;

line b: signal Ve detected by the measurement circuit; the reference signal level in the absence of a pulse is Vr, but Vr varies over time; Vr is equal to V1 just before the measurement pulse, to V2 at time T2, to V3 at time T3, but its level at these times is not precisely known; at time T2 however, the input signal Ve detected is Vm, representing the addition of the reference level V2 and the useful level due to the measurement pulse;

line c: period corresponding to the reset phase H1 of the first sampler; its duration is preferably the same as that of the measurement pulse; it ends at a time T1 just before the start of the measurement pulse; it begins at a time T0 such that T1−T0 is preferably equal to the duration of the measurement pulse;

line d: the sampling signal H2; it begins just after the end of the reset signal H1 and ends at a time T2 just before the end of the measurement pulse; its duration is that of the measurement pulse; this is also the reset signal for the second sampler;

line e: the sampling signal H3 of the second sampler; it lasts from T2 to T3; the time T3−T2 is preferably equal to T2−T1 and T1−T0;

line f: a period H4 (optional) allowing the subtractor to be activated only during the common hold phase of the two samplers, in other words after time T3 and before the next measurement; and line g: the output Vs from the subtractor, which has a value proportional to [Vm−(V3+V1)/2] during the time interval H4 and which may or may not be zero or equal to a previous value outside of these intervals.

The value Vs is then (within a factor of 2 or −2) very close to a theoretical value sought which would be Vm−V2, assuming (V1+V3)/2 may be considered as being very close to V2, which is generally the case when T3−T2 is equal to T2−T1. This assumes that the behavior of Vr may be considered as approximately linear over the time period T1, T3, and this assumption is reasonable in many applications.

Figure 7:
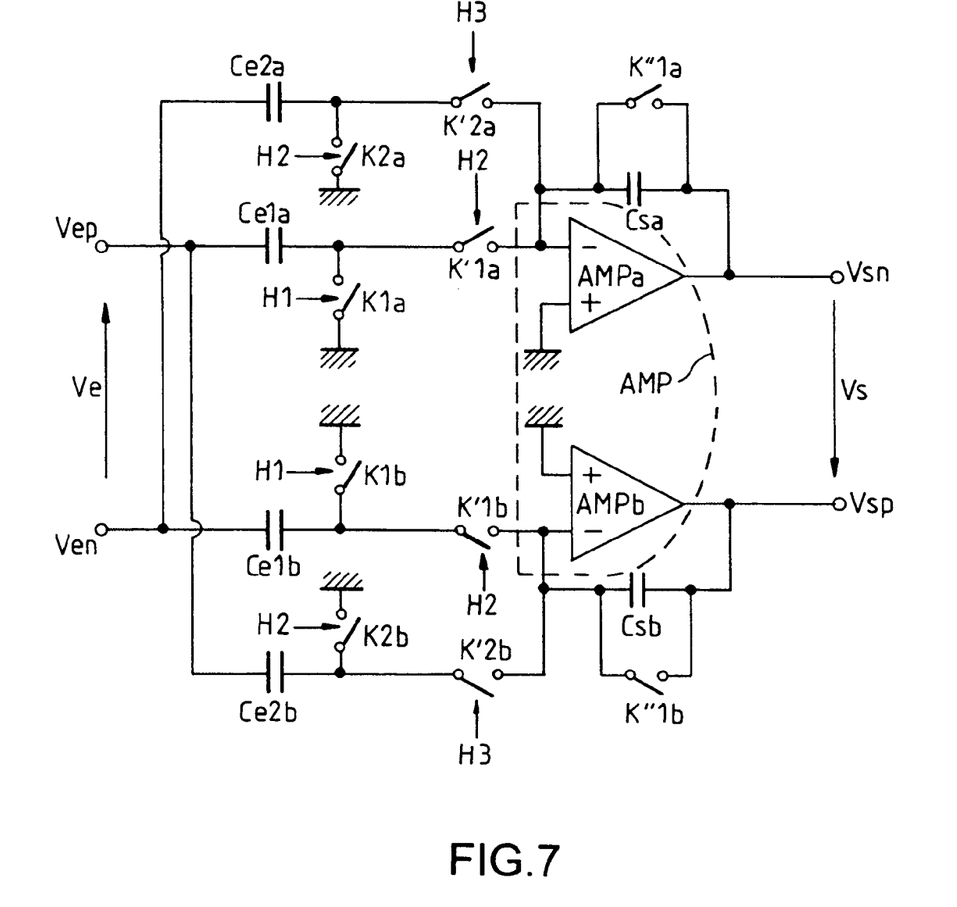
FIG. 7 shows a differential embodiment of the invention, with two operational amplifiers common to two sample-and-hold circuits.

FIG. 7 shows a practical embodiment in which the sample-and-hold circuit used is a differential sample-and-hold circuit inspired by that in FIG. 4; in this case, it is unnecessary to provide two differential samplers and a subtractor in order to implement the present invention. The same correlated triple sampling function can, in fact, be achieved with a single pair of operational amplifiers or (in an equivalent manner) a differential amplifier with two differential inputs and two differential outputs, by only adding other switched capacitors. The circuit diagram in FIG. 7 therefore starts from the circuit diagram in FIG. 4 or from another circuit diagram of differential sampler that has two operational amplifiers AMPa and AMPb with, for each one, an input capacitor Ce1a and Ce1b and an integrating capacitor Csa and Csb, and the switches that allow the operation in correlated double sampling mode; in addition, a pair of second switched input capacitors Ce2a and Ce2b are added to this circuit. The differential input voltage Ve, representing the signal to be measured, is applied to the pair of first input capacitors Ce1a and Ce1b. The inverse −Ve of this voltage Ve is applied to the pair of second input capacitors, which means that the connections from the input toward the two capacitors are crossed over.

More precisely, the differential voltage Ve to be measured is formed from two voltages Vep and Ven referenced relative to the electrical ground of the circuit. The voltage Vep is applied to the first input capacitor Ce1a associated with the first operational amplifier AMPa and it is also applied to the second input capacitor Ce2b associated with the second operational amplifier AMPb; similarly, the voltage Ven is applied to the first input capacitor Ce1b of the second amplifier AMPb and to the second input capacitor Ce2a of the first amplifier AMPa.

The integrating capacitors are each connected in parallel between the output and the inverting input of the amplifier with which they are respectively associated (Csa for AMPa and Csb for AMPb). The noninverting input of the amplifiers is grounded. The output Vsp is the output of the amplifier AMPb, the output Vsn is that of the amplifier AMPa; the differential output voltage is Vs=Vsp−Vsn.

The dashed line in FIG. 7 shows a frame AMP representing a single differential amplifier, demonstrating that there is an equivalence between the use of two single-ended amplifiers or one differential amplifier.

The input capacitors are all equal. The integrating capacitors are equal to one another and are in a proportionality ratio k with the input capacitors, where k depends on the voltage level that it is desired to obtain at the output; if k=2, the differential output voltage Vs=Vsp−Vsn between the outputs of the amplifiers during the hold phase, where all the switches are open, is equal to [(Ve−(V3+V1)/2] where V3 and V1 have the same meanings as previously, namely the reference voltage values (differential) at time T1 before the measurement pulse and at time T3 after the measurement pulse. If k is different from 2, the output voltage is divided by k/2.

The switch control signal timing diagrams are the same as in FIG. 6, with the exception of the signal H4 which is not necessary for the embodiment in FIG. 7.

In order to perform the correlated triple sampling, in the form of a double sampling between times T0 and T2 followed by a double sampling between times T1 and T3 as was explained with reference to FIGS. 5 and 6, in the circuit diagram in FIG. 7 are provided:

switches K1a and K1b connected between an input capacitor Ce1a or Ce1b, respectively, and ground, that are closed during the reset periods H1 (from T0 to T1) of the first double sampling operation, in order to be able to charge the capacitor Ce1a with a voltage V1p (input signal Vep at time T1) and the capacitor Ce1b with a voltage V1n (input signal Ven at time T1);

switches K'1a and K'1b connected between the capacitors Ce1a or Ce1b, respectively, and the inverting input of the associated amplifier (AMPa or AMPb, respectively); these switches are closed during the period H2 (between T1 and T2) in order to connect the capacitor Ce1a between the input Vep and the amplifier AMPa, and also the capacitor Ce1b between the input Ven and the amplifier AMPb, during the time interval T1,T2;

switches K"1a and K"1b in parallel with the integrating capacitor Csa and the integrating capacitor Csb, respectively;

switches K2a and K2b configured vis-à-vis the capacitors Ce2a and Ce2b, respectively, like the switches K1a and K1b are configured vis-à-vis the capacitors Ce1a and Ce1b, respectively; it is recalled that the capacitor Ce1a receives the voltage Vep and the capacitor Ce1b receives the voltage Ven; conversely, it is the capacitor Ce2b that receives Vep and the capacitor Ce2a that receives Ven; the switches K2a and K2b are closed during the phase H2 which is a sampling phase for the first double sampling operation and a reset phase for the second double sampling operation; and switches K2'a and K2'b configured vis-à-vis the amplifiers AMPa and AMPb, respectively, and vis-à-vis the capacitors Ce2a and Ce2b, respectively, like the switches K'1a and K'1b, respectively; the switches K'2a and K'2b are closed during the phase H3 which is a sampling phase of the second correlation operation.

The switches are all open during the hold phase that follows the phase H3 and which lasts until the next measurement step starting at time T'0.

During the first correlated double sampling operation, from T0 to T2, the reset phase (H1) resets the charge on the integrating capacitors Csa and Csb to zero and applies to Ce1a and Ce1b the input voltages Vep and Ven, respectively, which are then equal to a reference of level V1p and V1n, respectively, with an initial differential level V1=V1p−V1n. The values V1p, V1n, and their difference V1, represent the reference voltage levels before the measurement pulse. Subsequently, the sampling phase divides, at T2, the charge thus reset on Ce1a between Ce1a and Csa, at the same time as the measurement voltage Vep, resulting from the useful signal to be measured, is applied to the input of Ce1a; at the output of the amplifier AMPa, an output voltage Vsn=−(Vep−V1p)/2 is established, assuming that the integrating capacitors have twice the value of the input capacitors.

Similarly, a voltage Vsp=−(Ven−V1n)/2 is established at the output of AMPb.

At the same time (time T2), initial charges are stored in the capacitors Ce2a and Ce2b since the phase H2 is the reset phase of the second correlated double sampling operation. These charges are:

on Ce2a: a charge corresponding to the voltage Ven
on Ce2b: a charge corresponding to the voltage Vep.

In the course of the phase H3, sampling phase of the second correlated double sampling operation, the charge on Ce2a is divided between the capacitor Ce2a and the capacitor Csa; the charge on the capacitor Ce2b is divided between the capacitor Ce2b and the capacitor Csb. At the same time, at time T3, the voltage applied to the input terminal of Ce2a is Ven=V3n and the voltage applied to the input of Ce2b is Vep=V3p.

V3n and V3p are the input voltages at time T3 and correspond to the reference level outside of the measurement pulse after this pulse. V3=V3p−V3n is the differential reference voltage at this time T3.

At the output of the amplifier AMPa, the result of this is a voltage $Vsn=-(Vep-V1p)/2-(V3n-Ven)/2$ and, at the output of the amplifier AMPb, a voltage $Vsp=-(Ven-V1n)/2-(V3p-Vep)/2.$ The differential output voltage between the outputs of AMPb and AMPa is then $Vs=Vsp-Vsn=(Vep-Ven)-(V1p-V1n)/2-(V3p-V3n)/2$ or $Vs=Ve-(V1+V3)/2.$ A measurement of the useful signal Ve is therefore obtained with respect to a reference level (V1+V3)/2 that is intermediate between V1 (reference before the measurement pulse) and V3 (reference after the pulse). This intermediate reference level is the average of V1 and V3 and represents a very good approximation to the probable reference level existing at time T2 where this level is not measurable, with the assumption that the variation of the reference level may be considered as being linear and assuming that T2 is equidistant from T1 and T3.

In the circuit diagram in FIG. 7, switches K"1a and K"1b are provided for periodically resetting the charge on the integrating capacitors Csa and Csb to zero before a sampling phase H2. However, these switches are optional: indeed, another means for resetting the sample-and-hold circuit can be provided. This means consists in periodically re-injecting into the negative input of each operational amplifier, by means of switched capacitors, a voltage equal to the inverse of the mean value of the output signal from the differential sampler.

Figure 8:
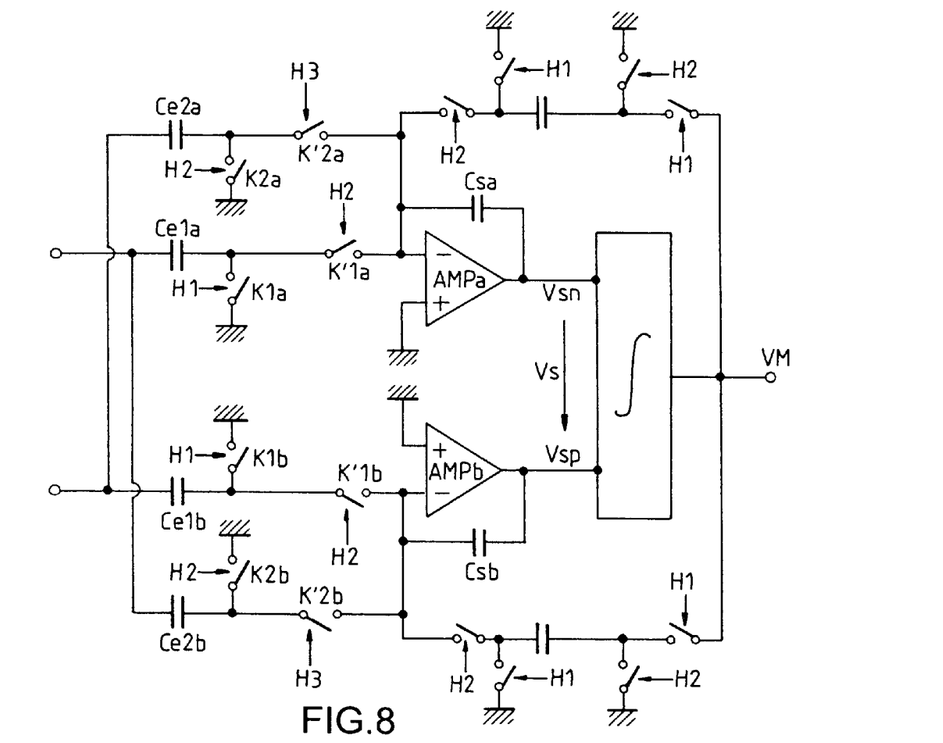
FIG. 8 shows another differential embodiment, without switches for zero reset of the integrating capacitors.

In this case, as shown in FIG. 8, at the output of the operational amplifiers, an integrating filter FL is disposed that receives the differential output from the sample-and-hold circuit and that establishes a mean value of this output. This mean value VM is re-injected into the inverting input of the amplifier AMPa and into that of the amplifier AMPb, by means of switched capacitor systems, during phases H1 and H2.

The advantage of this solution becomes apparent in cases where filtering the measurement performed in synchronous detection mode is, in any case, necessary for measuring the mean of the detected signal. In this case, the integrating filter is, in any case, available and it is therefore preferable to use it rather than providing the switches K"1a and K"1b.

Figure 9:
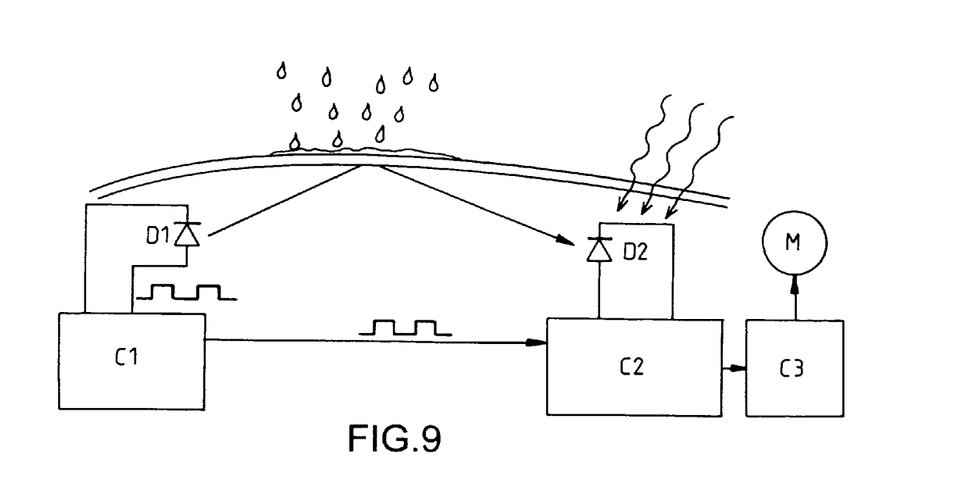
FIG. 9 shows an application of the invention to the detection of rain on a windshield.

FIG. 9 shows an exemplary application where the invention is particularly appropriate. This is the detection of rain on a vehicle windshield PB, with a view to triggering the motion of a windshield wiper. A photo-electric cell is used, comprising for example a light-emitting diode D1 and a photodiode D2.

A light-emitting diode D1 periodically emits light pulses under the control of a circuit C1. A detection photodiode D2 receives these pulses after reflection on the windshield, but it also receives the ambient light. The reflection coefficient of the windshield depends on whether the latter receives rain or not. The signal delivered by the photodiode D2 to a measurement circuit C2 is a measurement of the ambient illumination, but it increases during the light pulses since it then corresponds to the addition of the ambient illumination and the additional illumination supplied by the reflection on the windshield of the emission from the light-emitting diode D1.

The circuit C2 is a circuit according to the invention such as is described hereinabove. The circuit C1 (or another sequencing circuit) supplies the control signals H1, H2, H3 for the circuit C2 in accordance with the diagrams explained hereinabove, so that the circuit C2 operates in synchronism with the circuit C1.

The circuit C2 delivers a useful signal value, filtered if necessary, which is supplied to a decision circuit C3. The decision circuit evaluates the signal values and compares them with one or more thresholds in order to determine the presence or the absence of rain and control the activation of a windshield wiper drive motor M in the case where rain is detected.

The invention claimed is:

1. A measurement method comprising emitting a light pulse form a light source and producing a measurement signal in a photodetector, said measurement signal having a variable reference level in the absence of the light pulse and a modified value during the light pulse, said method comprising the steps of performing, within a sample-and-hold circuit: a first correlated double sampling between a time T1 situated just before the start of the measurement pulse and a time T2 situated just before the end of the measurement pulse, this double sampling supplying a first value of said measurement signal considered with respect to a first value V1 of said reference level before the start of the pulse; a second correlated double sampling between time T2 and a time T3 situated after the end of the measurement pulse, this second correlated double sampling supplying a second value of said measurement signal considered with respect to a second value V3 of said reference level existing after the end of the pulse; and in establishing a difference between the first and second values of the measurement signals, this difference being a representation of the measurement signal considered with respect to an intermediate reference level that is comprised between the first and second values of the reference level.

2. The measurement method as claimed in claim 1, wherein the time interval T3−T2 is substantially equal to T2−T1.

3. The measurement method as claimed in claim 2, wherein the time interval T3−T2 is substantially equal to the duration of the measurement pulse.

4. The measurement method as claimed in claim 3, wherein it is applied to the detection of rain on a vehicle windshield, said light pulse being emitted toward the windshield and reflected with a reflection coefficient that depends on the presence or the absence of rain on the windshield.

5. The measurement method as claimed in claim 2, wherein it is applied to the detection of rain on a vehicle windshield, said light pulse being emitted toward the windshield and reflected with a reflection coefficient that depends on the presence or the absence of rain on the windshield.

6. The measurement method as claimed in claim 1, wherein the time interval T3−T2 is substantially equal to the duration of the measurement pulse.

7. The measurement method as claimed in claim 6, wherein it is applied to the detection of rain on a vehicle windshield, said light pulse being emitted toward the windshield and reflected with a reflection coefficient that depends on the presence or the absence of rain on the windshield.

8. The measurement method as claimed in claim 1, wherein it is applied to the detection of rain on a vehicle windshield, said light pulse being emitted toward the windshield and reflected with a reflection coefficient that depends on the presence or the absence of rain on the windshield.

9. A measurement device with detection that is synchronous with respect to a measurement pulse which causes a temporary increase in a measurement signal with respect to a variable reference level of said measurement signal, comprising at least a light source for producing said measurement pulse, a photodetector for producing said measurement signal, a sample and hold circuit and switching means that are synchronized with the measurement pulse, said switching means controlling said sample and hold circuit to execute:

a first correlated double sampling between a time T1 situated just before the start of the measurement pulse and a time T2 situated just before the end of the measurement pulse, this double sampling supplying a first value of the measurement signal considered with respect to a first value V1 of the reference level before the start of the pulse;

a second correlated double sampling between time T2 and a time T3 situated after the end of the measurement pulse (preferably T3−T2=T2−T1), this second sampling supplying a second value of the measurement signal considered with respect to a second value V2 of the reference level existing after the end of the pulse, and the measurement device comprising means for establishing a difference between said first and second values of the measurement signal, this difference being a representation of the measurement signal considered with respect to an intermediate reference level value that is comprised between the first and second values of the reference levels.

10. The device as claimed in claim 9, wherein the measurement signal is a voltage having a values Vm at time T2, the first value of the reference level is a voltage V1, the second value of the reference level is a voltage V2, the first value of the measurement signal being a difference V1−Vm established by a first sample and hold circuit and the second value of the measurement signal being a difference Vm−V3 established by a second sample and hold circuit, said device further comprising a subtractor at the output of the sample-and-hold circuits for performing the difference sought.

11. The device as claimed in claim 9, wherein the sample-and-hold circuit is differential and comprises two signal inputs and a differential amplifier having two inputs and two outputs, each amplifier input being associated with a first and a second input capacitor placed upstream of this amplifier input, and being also associated with an integrating capacitor connected between the input and a corresponding output of the amplifier, the signal inputs of the sample and hold circuit which are connected to the first input capacitors being crossed with respect to the signal inputs connected to the second input capacitors; the switching means comprising:

means for making the sample-and-hold circuit operate as a correlated double sample-and-hold using the integrating capacitors and the first input capacitors, by initially applying, across the first input capacitors, a differential input voltage V1p−V1n representing the reference level V1 at time T1 and by later applying a differential input voltage Vmp−Vmn representing the measurement signal Vm at time T2;

means for making the differential sample-and-hold operate as a correlated double sampler, using the integrating capacitors and the second input capacitors, by initially applying, across the second input capacitors, a differential input voltage Vmn−Vmp representing the inverse −Vm of the measurement signal at time T2 and by later applying a differential input voltage V3n−V3p representing the inverse −V3 of the reference level at time T3.

12. The device as claimed in claim 9, wherein the operational amplifiers are equipped with a switch for periodically discharging the integrating capacitor.

13. The device as claimed in claim 12, wherein a means is provided for periodically applying a voltage representing the inverse of the mean value of the output signal of the differential sampler to one input of each operational amplifier.

* * * * *